(12) United States Patent
Chen

(10) Patent No.: US 10,969,888 B2
(45) Date of Patent: Apr. 6, 2021

(54) TOUCH PANEL MANUFACTURING METHOD, TOUCH PANEL, AND DISPLAY DEVICE

(71) Applicants: Hefei Xinsheng Optoelectronics Technology Co., Ltd., Hefei (CN); BOE Technology Group Co., Ltd., Beijing (CN)

(72) Inventor: Ronglong Chen, Beijing (CN)

(73) Assignees: Hefei Xinsheng Optoelectronics Technology Co., Ltd., Anhui (CN); BOE Technology Group Co., Ltd., Beijing (CN)

(*) Notice: Subject to any disclaimer, the term of this patent is extended or adjusted under 35 U.S.C. 154(b) by 3 days.

(21) Appl. No.: 16/323,431

(22) PCT Filed: Feb. 28, 2018

(86) PCT No.: PCT/CN2018/077523
§ 371 (c)(1),
(2) Date: Feb. 5, 2019

(87) PCT Pub. No.: WO2018/157814
PCT Pub. Date: Sep. 7, 2018

(65) Prior Publication Data
US 2019/0179468 A1    Jun. 13, 2019

(30) Foreign Application Priority Data

Mar. 2, 2017   (CN) .......................... 201710119812.1

(51) Int. Cl.
*G06F 3/041* (2006.01)
*G09G 5/00* (2006.01)
(Continued)

(52) U.S. Cl.
CPC .......... *G06F 3/0412* (2013.01); *G06F 3/0443* (2019.05); *G06F 3/0446* (2019.05);
(Continued)

(58) Field of Classification Search
CPC .... G06F 3/0412; G06F 3/0446; G06F 3/0443; G09G 5/003; H05K 3/02
(Continued)

(56) References Cited

U.S. PATENT DOCUMENTS

2014/0125597 A1* 5/2014 Lee .......................... G06F 3/044
345/173
2015/0103266 A1   4/2015 Hao et al.
(Continued)

FOREIGN PATENT DOCUMENTS

CN   102621736 A  *  8/2012
CN   102621736 A     8/2012
(Continued)

OTHER PUBLICATIONS

Jun. 6, 2018—(WO) International Search Report and Written Opinion Appn PCT/CN2018/077523 with English Translation.

*Primary Examiner* — Binh X Tran
(74) *Attorney, Agent, or Firm* — Banner & Witcoff, Ltd.

(57) ABSTRACT

A touch panel manufacturing method, a touch panel and a display device are provided, and the method includes: forming a black frame on a substrate; forming a removable adhesive layer in a display region of the substrate having the black frame; forming a metal layer on the black frame and the removable adhesive layer; removing the removable adhesive layer in the display region and a first part of the metal layer located in the display region; performing photolithography on the substrate where the removable adhesive layer and first part of the metal layer have been removed, thus producing a touch panel.

19 Claims, 7 Drawing Sheets

(51) Int. Cl.
*H05K 3/02* (2006.01)
*G06F 3/044* (2006.01)

(52) U.S. Cl.
CPC ............... *G09G 5/003* (2013.01); *H05K 3/02* (2013.01); *G06F 2203/04103* (2013.01); *G06F 2203/04111* (2013.01); *G09G 2300/04* (2013.01)

(58) Field of Classification Search
USPC .......................................................... 216/13
See application file for complete search history.

(56) References Cited

U.S. PATENT DOCUMENTS

2016/0370890 A1* 12/2016 Du ........................ G06F 3/0443
2019/0179468 A1   6/2019 Chen

FOREIGN PATENT DOCUMENTS

| CN | 103500036 A |   | 1/2014  |             |
|----|-------------|---|---------|-------------|
| CN | 104391609 A | * | 3/2015  | G06F 3/0443 |
| CN | 105589598 A |   | 5/2016  |             |
| CN | 106909251 A |   | 6/2017  |             |

* cited by examiner

TOUCH PANEL MANUFACTURING METHOD, TOUCH PANEL, AND DISPLAY DEVICE

The application is a U.S. National Phase Entry of International Application No. PCT/CN2018/077523 filed on Feb. 28, 2018, designating the United States of America and claiming priority to Chinese Patent Application No. 201710119812.1 filed on Mar. 2, 2017. The present application claims priority to and the benefit of the above-identified applications and the above-identified applications are incorporated by reference herein in their entirety.

TECHNICAL FIELD

Embodiments of the present disclosure relate to a touch panel manufacturing method, a touch panel and a display device.

BACKGROUND

In the structure of an one glass solution (OGS) touch panel, for instance, a touch sensor formed by an indium tin oxide (ITO) conductive film is directly formed on a base substrate (e.g., a glass substrate) in a protective substrate of the OGS touch panel, and in this case, the protective substrate has the dual functions of protecting and bearing the touch sensor. As seen from the technology level, the OGS touch panel has the following advantages: simple structure, light and thin design, and good transmittance. Moreover, because one glass substrate and a corresponding bonding process are omitted, the production cost can be reduced and the product yield can be improved.

SUMMARY

Embodiments of the present disclosure relate to a touch panel manufacturing method, a touch panel and a display device, and the embodiments of the present disclosure simplify the manufacturing process of the touch panel.

At least one embodiment of the present disclosure provides a touch panel manufacturing method, which includes: forming a black frame on the substrate; forming a removable adhesive layer in a display region of the substrate provided with the black frame; forming a metal layer on the black frame and the removable adhesive layer; removing the removable adhesive layer in the display region and a first part of the metal layer in the display region; and obtaining a touch panel by performing photolithography on the substrate obtained after removing the removable adhesive layer and the first part of the metal layer in the display region.

In some embodiments of the present disclosure, the obtaining the touch panel by performing the photolithography on the substrate obtained after the removing the removable adhesive layer and the first part of the metal layer in the display region, includes: forming a transparent conductive material on the substrate obtained after the removing the removable adhesive layer and the first part of the metal layer in the display region; and forming transparent conductive bridges, transparent conductive leading wires and metal leading wires, by etching the transparent conductive material and etching a second part of the metal layer in a region provided with the black frame, on the substrate provided with the transparent conductive material.

In some embodiments of the present disclosure, the etching the transparent conductive material and the etching the second part of the metal layer are performed in a same photolithography process.

In some embodiments of the present disclosure, the obtaining the touch panel by performing the photolithography on the substrate obtained after the removing the removable adhesive layer and the first part of the metal layer in the display region further includes: forming an insulating layer on the substrate obtained after the etching the transparent conductive material and the etching the second part of the metal layer.

In some embodiments of the present disclosure, the obtaining the touch panel by performing the photolithography on the substrate obtained after the removing the removable adhesive layer and the first part of the metal layer in the display region further includes: obtaining the touch panel by forming an electrode layer in the display region of the substrate provided with the insulating layer.

In some embodiments of the present disclosure, the electrode layer includes a plurality of discrete electrode patterns and a continuous electrode pattern between the plurality of discrete electrode patterns; and adjacent ones of the plurality of discrete electrode patterns are electrically connected with each other through one of the transparent conductive bridges.

In some embodiments of the present disclosure, a leading-wire connection bridge close to the metal leading wires is formed by the etching the transparent conductive material; and one of the plurality of discrete electrode patterns and one of the metal leading wires are adjacent to the leading-wire connection bridge and are electrically connected with each other through the leading-wire connection bridge.

In some embodiments of the present disclosure, the continuous electrode pattern is in contact with a lateral surface of one of the transparent conductive leading wires and a lateral surface of another one of the metal leading wires.

In some embodiments of the present disclosure, orthographic projections of the transparent conductive leading wires on the substrate coincide with orthographic projections of the metal leading wires on the substrate, respectively.

In some embodiments of the present disclosure, the transparent conductive material is in direct contact with the second part of the metal layer.

In some embodiments of the present disclosure, the forming the removable adhesive layer in the display region of the substrate provided with the black frame includes: forming the removable adhesive layer in the display region of the substrate provided with the black frame by screen printing process.

In some embodiments of the present disclosure, a thickness of the removable adhesive layer is greater than a height of the black frame.

In some embodiments of the present disclosure, the removing the removable adhesive layer in the display region and the first part of the metal layer in the display region includes: bonding an adhesive strip to the metal layer in the display region; and by peeling off the adhesive strip to separate the removable adhesive layer in the display region from the substrate, removing the removable adhesive layer in the display region and the metal layer in the display region.

In some embodiments of the present disclosure, a cohesive force between the adhesive strip and the metal layer is greater than a cohesive force between the removable adhesive layer and the substrate; and a cohesive force between the metal layer and the removable adhesive layer is greater than the cohesive force between the removable adhesive layer and the substrate.

In some embodiments of the present disclosure, the cohesive force between the removable adhesive layer and the substrate is less than a cohesive force between the metal layer and the black frame.

At least one embodiment of the present disclosure provides a touch panel manufacturing method, which includes: forming a removable adhesive layer in a display region of the substrate; forming a metal layer on the substrate provided with the removable adhesive layer, wherein the metal layer includes a first part on the removable adhesive layer and in the display region and a second part in a frame region that is outside the display region of the substrate; removing the removable adhesive layer in the display region and the first part of the metal layer in the display region; forming a transparent conductive material on the substrate obtained after the removing the removable adhesive layer and the first part of the metal layer in the display region, wherein the transparent conductive material is in the display region and the frame region; and forming a transparent conductive bridge, a transparent conductive leading wire and a metal leading wire by patterning the transparent conductive material and patterning the second part of the metal layer in the frame region in a same photolithography process.

At least one embodiment of the present disclosure further provides a touch panel, which is manufactured by the touch panel manufacturing method described in any one of the above embodiments.

At least one embodiment of the present disclosure further provides a touch panel, which includes: a substrate which includes a display region and a frame region outside the display region; a first touch electrode in the display region, wherein the first touch electrode includes a plurality of discrete electrode patterns and a transparent conductive bridge that is between adjacent ones of the plurality of discrete electrode patterns and is electrically connected with the adjacent ones of the plurality of discrete electrode patterns; a second touch electrode in the display region, wherein the second touch electrode intersects the first touch electrode; and a plurality of leading wires in the frame region and respectively electrically connected with the first touch electrode and the second touch electrode. In the touch panel, each leading wire includes a metal leading wire and a transparent conductive leading wire which overlap with each other and directly contact with each other; and an orthographic projection of the metal leading wire on the substrate coincides with an orthographic projection of the transparent conductive leading wire on the substrate.

In some embodiments of the present disclosure, the touch panel further includes an insulating layer, and the insulating layer includes a part at an intersection of the first touch electrode and the second touch electrode to insulate the first touch electrode from the second touch electrode.

At least one embodiment of the present disclosure further provides a display device, which includes the touch panel according to any one of the above embodiments.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1:
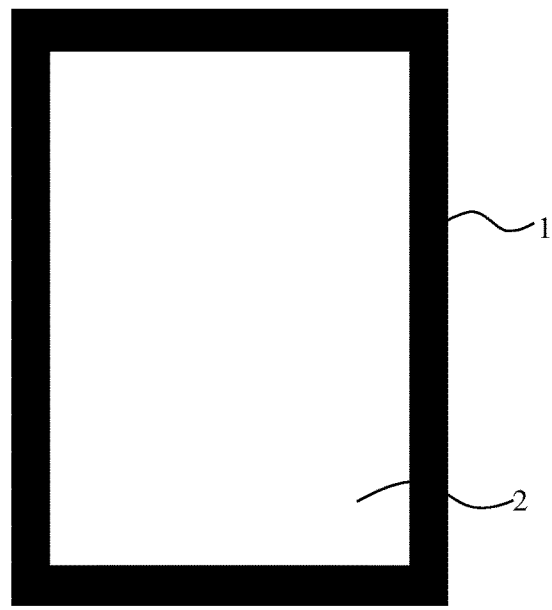
FIG. 1 is a schematic structural view of a touch panel provided by the embodiments of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Taking the structure that the touch sensor in an OGS touch panel adopts an ITO bridge to connect adjacent ITO patterns as an example, the manufacturing process of the OGS touch panel at least requires 5 masks which are respectively: a first mask for forming a black matrix (BM), a second mask for forming the ITO bridge, a third mask for forming metal leading wires, a fourth mask for forming an insulating layer (e.g., an OC layer), and a fifth mask for forming the ITO patterns.

The inventor of the application has noticed in the study that in the above manufacturing process, high-generation-line quartz masks have high price, resulting in high cost in product development and production. Moreover, the manufacturing process of the ITO bridge and the manufacturing process of the metal leading wires are the key processes in the manufacturing process of the touch panel and are also processes leading to high occurrence of poor electrical performance. In the manufacturing process using the above 5 masks, the manufacturing process of the ITO bridge and the manufacturing process of the metal leading wires are subjected to separated photolithography processes, which increases the occurrence probability of poor electrical performance and also increases the equipment utilization rate of the photolithography processes.

As shown in FIG. 1 which is a schematic structural view of a touch panel provided by the embodiments of the present disclosure, a frame region (border region) of the touch panel is provided with a black frame (black border) 1, and a region encircled by the black frame 1 is a display region 2.

For instance, the black frame 1 is a black matrix frame, a black ink frame or a light-shielding frame of other types. For instance, as shown in FIG. 1, the black frame 1 is a closed ring structure. In other embodiments, the black frame 1 may be a non-closed structure. For instance, in a borderless or narrow-border touch panel, at least one side of the touch panel is not provided with the black frame 1.

Figure 2:
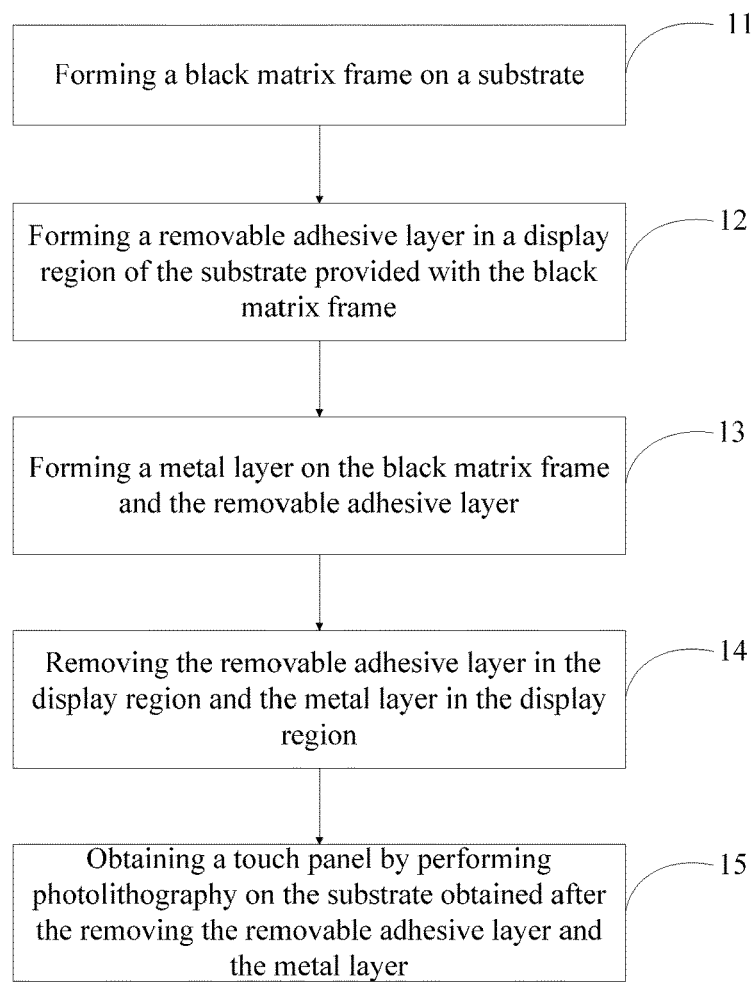
FIG. 2 is a flowchart of a touch panel manufacturing method provided by one embodiment of the present disclosure.

In one embodiment of the present disclosure, as shown in FIG. 2, the touch panel manufacturing method includes the following steps S11 to S15.

S11: forming the black frame on the substrate.

S12: forming a removable adhesive layer in the display region of the substrate provided with the black frame.

S13: forming a metal layer on the black frame and the removable adhesive layer.

S14: removing the removable adhesive layer in the display region and removing a first part that the metal layer includes in the display region.

S15: obtaining the touch panel by performing photolithography on the substrate obtained after the step of removing the removable adhesive layer and removing the first part of the metal layer in the display region.

In the touch panel manufacturing method provided by the embodiments of the present disclosure, the removable adhesive layer is only formed in the display region of the substrate provided with the black frame at first, and then the metal layer is formed on both the black frame and the removable adhesive layer; and subsequently, the removable adhesive layer in the display region and the first part that the metal layer includes in the display region are stripped off, and a second part that the metal layer includes in the black frame 1 is retained (namely the metal layer in the frame region is retained). In this way, the manufacturing process of the touch panel can reduce the above 5 mask processes to 4 mask processes (namely reducing one mask process), thereby simplifying the manufacturing process, effectively improving the productivity of the manufacturing process using the masks, and reducing the cost in the product development and production. Moreover, in the touch panel manufacturing method provided by the embodiments of the present disclosure, due to the bonding between the metal layer and the removable adhesive layer in the display region (for instance, the metal layer and the removable adhesive layer are directly bonded), the metal layer in the display region is directly removed by utilization of the removable adhesive layer, and the removing of the metal layer in the display region does not need exposure and etching processes, so the metal residue in the display region caused by the exposure and etching processes can be effectively avoided.

Detailed description will be given below to the touch panel manufacturing method as shown in FIG. 2 with reference to FIG. 3 to FIG. 6.

S11: forming the black frame on the substrate.

Figure 3:
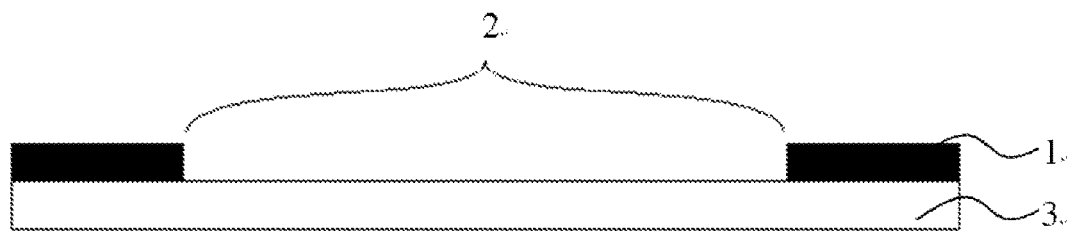
FIG. 3 is a schematic structural view illustrating that a black frame is formed on the substrate in the embodiments of the present disclosure.

For instance, as shown in FIG. 3 which is a schematic structural view illustrating that the black frame is formed on the substrate in the embodiments of the present disclosure, in the step S11, a material for forming the black frame (e.g., a black matrix material) may be formed (e.g., deposited) on the substrate 3; and the black frame 1 is formed by patterning the material for forming the black frame by a mask process. The black frame 1 is mainly used for shielding light in the frame region of the substrate 3 and shielding the arrangement of metal wires in the frame region. In the step S11, the region encircled by the black frame 1 is the display region 2.

S12: forming the removable adhesive layer in the display region of the substrate provided with the black frame.

Figure 4:
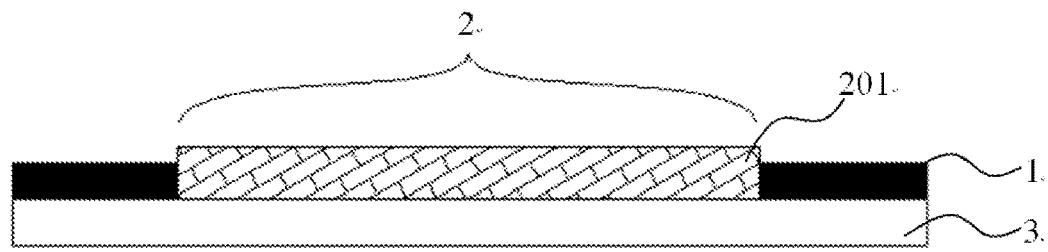
FIG. 4 is a schematic structural view illustrating that a removable adhesive layer is formed in a display region in the embodiments of the present disclosure.

For instance, as shown in FIG. 4 which is a schematic structural view illustrating that the removable adhesive layer is formed in the display region in the embodiments of the present disclosure, the removable adhesive layer 201 is formed in the display region 2 of the substrate 3 provided with the black frame 1, and the removable adhesive layer 201 is disposed outside the frame region provided with the black frame 1.

For instance, the entire display region 2 is provided with the removable adhesive layer 201, so the removable adhesive layer 201 extends to an inner edge of the black frame 1 (namely an edge close to the display region 2).

For instance, the substrate 3 is a glass substrate or quartz substrate, and the removable adhesive layer 201 is in direct contact with the substrate 3, so the removable adhesive layer 201 can be easily stripped off from the substrate 3.

In one embodiment of the present disclosure, for example, the removable adhesive layer 201 is formed in the display region 2 of the substrate 3 provided with the black frame 1 by screen printing process, so not only the removable adhesive layer 201 can be conveniently formed in the display region 2 but also the uniform removable adhesive layer 201 can be favorably formed. In other embodiments, the removable adhesive layer 201 can be formed in the display region 2 by other means, not limited to the screen printing process.

For instance, a thickness of the removable adhesive layer 201 is different from a thickness of the black frame 1 (the thickness here refers to a size along a direction perpendicular to a support surface of the substrate 3), so as to facilitate the stripping off of the removable adhesive layer in the display region 2 and the metal layer in the display region 2.

In another embodiment of the present disclosure, as shown in FIG. 4, the thickness of the removable adhesive layer 201 is greater than the height (namely the thickness) of the black frame 1, so that there is a dividing line (referring to FIG. 5) between the first part of the metal layer 202 at a boundary of the display region 2 and the second part of the metal layer 202 at a boundary of the black frame 1 (the boundary of the black frame 1 is close to the display region 2), thereby facilitating the removing of the removable adhesive layer 201 in the display region 2 and the first part of the metal layer 202 in the display region 2.

In still another embodiment of the present disclosure, the thickness of the removable adhesive layer 201 is less than the height of the black frame 1, so that there is a dividing line between the first part of the metal layer 202 at the boundary of the display region 2 and the second part of the metal layer 202 at the boundary of the black frame 1, thereby facilitating the removing of the removable adhesive layer 201 in the display region 2 and the first part of the metal layer 202 in the display region 2.

For instance, in a situation where the thickness of the removable adhesive layer 201 is different from the thickness of the black frame 1, both the removable adhesive layer 201 and the black frame 1 are in direct contact with the substrate 3, as shown in FIG. 4.

S13: forming the metal layer on both the black frame and the removable adhesive layer.

Figure 5:
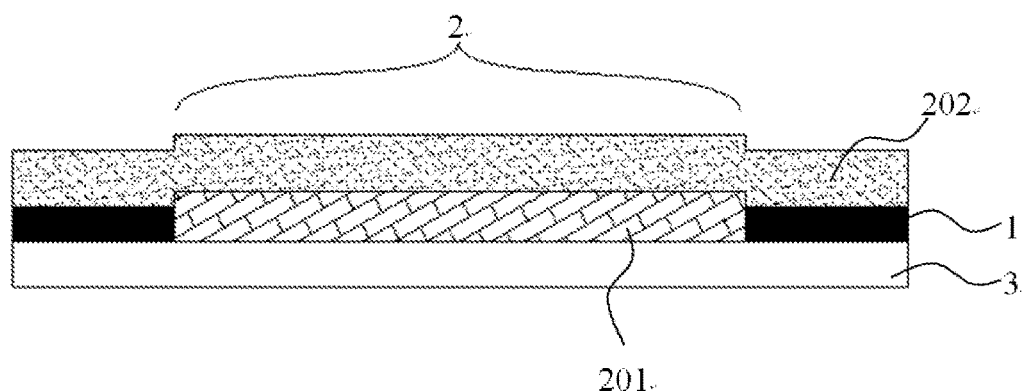
FIG. 5 is a schematic structural view illustrating that a metal layer is formed on the black frame and the removable adhesive layer in the embodiments of the present disclosure.

For instance, as shown in FIG. 5 which is a schematic structural view illustrating that the metal layer and the removable adhesive layer is formed on the black frame in the embodiments of the present disclosure, in the step S13, the metal layer 202 may be formed on the black frame 1 and the removable adhesive layer 201 simultaneously by metal deposition or metal sputtering process, namely the metal layer 202 may be formed on the black frame 1 and the removable adhesive layer 201 by the same process, so the touch panel manufacturing process can be simplified.

In the step S13, the material of the metal layer for forming metal leading wires is, for instance, aluminum (Al), Al alloy, copper (Cu), Cu alloy, Molybdenum (Mo), niobium (Nb), Mo—Nb alloy or similar metal. The metal layer may have a one-layer structure or multi-layer structure.

For instance, as shown in FIG. 5, the metal layer 202 is directly formed on the black frame 1 and the removable adhesive layer 201, so that the metal layer 202 is in direct contact with both the black frame 1 and the removable adhesive layer 201.

S14: removing the removable adhesive layer in the display region and the metal layer in the display region.

Figure 6:
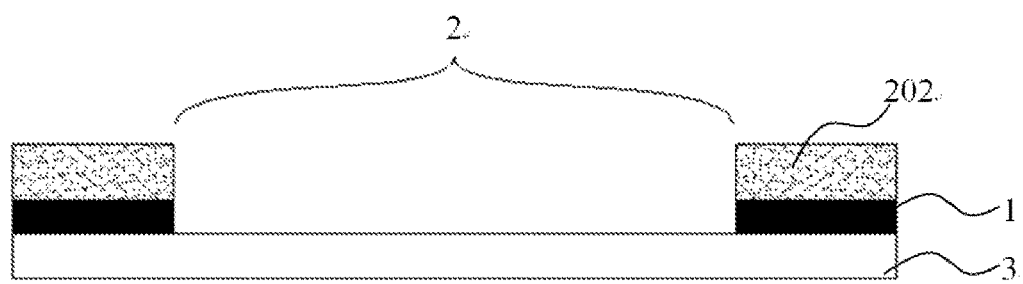
FIG. 6 is a schematic structural view illustrating that the removable adhesive layer in the display region and the metal layer in the display region are removed in the embodiments of the present disclosure.

For instance, as shown in FIG. 6 which is a schematic structural view illustrating that the removable adhesive layer and the metal layer which are in the display region are removed in the embodiments of the present disclosure, because the removable adhesive layer 201 can be easily stripped off from the substrate 3, the metal layer 202 disposed on the removable adhesive layer 201 can be also stripped off from the substrate 3 in the situation where the removable adhesive layer 201 is stripped off from the substrate 3, and then the structure as shown in FIG. 6 is obtained. As can be seen, the touch panel manufacturing method provided by the embodiments of the present disclosure utilizes the removable adhesive layer to directly remove the metal layer in the display region, and hence can effectively avoid the metal residue in the display region caused by the exposure and etching processes.

Figure 15:
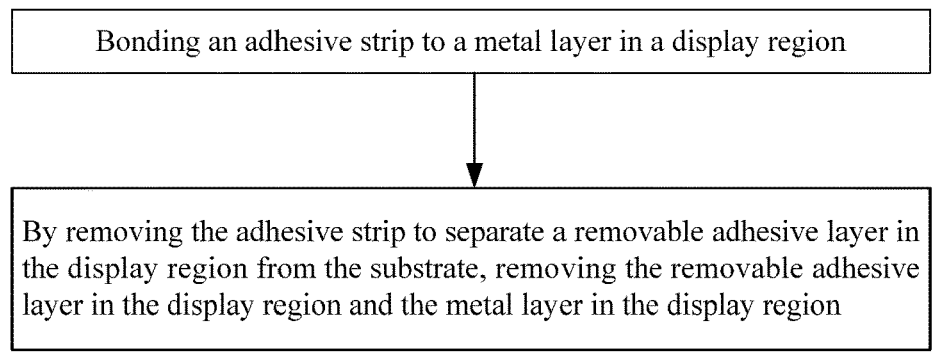
FIG. 15 is a flowchart illustrating the process of removing the removable adhesive layer in the display region and the metal layer in the display region in the touch panel manufacturing method provided by the embodiments of the present disclosure.

In one embodiment of the present disclosure, as shown in FIG. 15, the step S14 of removing the removable adhesive layer and the metal layer in the display region may include: bonding an adhesive strip to the metal layer in the display region (for instance, the adhesive strip directly contact the metal layer) and allowing the adhesive strip to be outside the frame region provided with the black frame; and by peeling off the adhesive strip to separate the removable adhesive layer in the display region from the substrate, removing the removable adhesive layer and the metal layer in the display region.

Therefore, the touch panel manufacturing method provided by the embodiments of the present disclosure separates the removable adhesive layer 201 and the metal layer 202 which are in the display region 2 from the substrate 3 by peeling off the adhesive strip (not shown) with larger viscosity on the metal layer 202 in the display region 2, and then removes the removable adhesive layer 201 and the metal layer 202 which are in the display region 2.

In still another embodiment of the present disclosure, a cohesive force between the adhesive strip and the metal layer is greater than a cohesive force between the removable adhesive layer and the substrate, and a cohesive force between the metal layer and the removable adhesive layer is greater than the cohesive force between the removable adhesive layer and the substrate, so as to ensure that the adhesive strip can completely separate the removable adhesive layer from the substrate, thereby removing the removable adhesive layer and the metal layer which are in the display region.

For instance, the cohesive force between the removable adhesive layer and the substrate is less than a cohesive force between the part (the second part) of the metal layer on the black frame and the black frame, so as to avoid the second part of the metal layer on the black frame from falling off the black frame.

S15: obtaining the touch panel by performing the photolithography on the substrate obtained after the process of removing the removable adhesive layer and the metal layer.

For instance, on the basis of the structure as shown in FIG. 6, the subsequent photolithography process is continued to form transparent conductive bridges, transparent conductive leading wires, metal leading wires, an insulating layer, an electrode layer and the like, and then the touch panel is manufactured.

As can be seen, in the touch panel manufacturing method provided by the embodiments of the present disclosure, the removable adhesive layer is formed in the display region of the substrate provided with the black frame at first, and then the metal layer is formed on the black frame and the removable adhesive layer; and subsequently, the removable adhesive layer in the display region and the part of the metal layer disposed in the display region are stripped off. In this case, the touch panel manufacturing method can reduce 5 mask processes to 4 mask processes (reducing one mask process). Therefore, the manufacturing process is simplified; the productivity of the manufacturing process using the masks is effectively improved; and the cost in product development and production is reduced.

Figure 7:
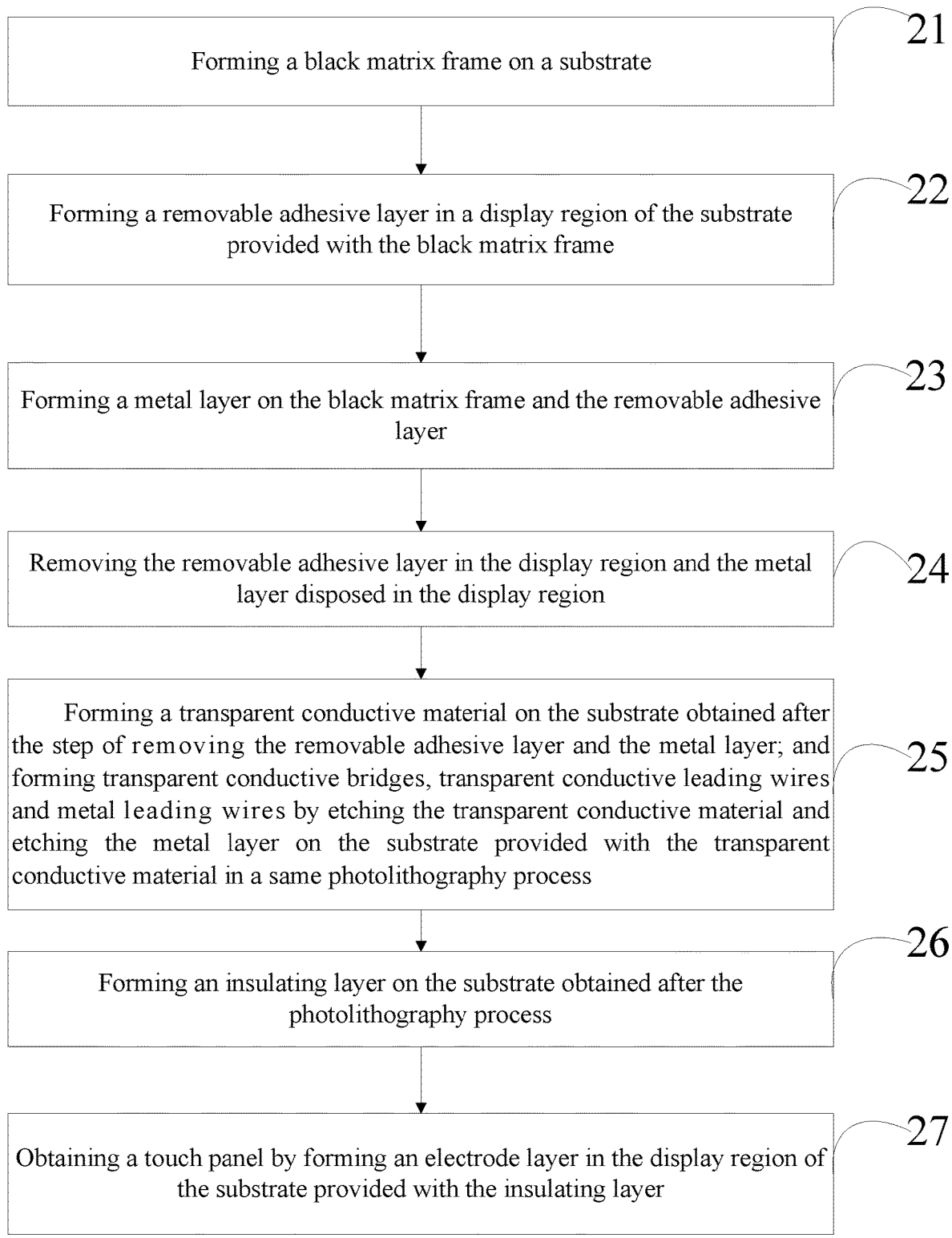
FIG. 7 is a flowchart of the touch panel manufacturing method provided by another embodiment of the present disclosure.

In another embodiment of the present disclosure, as shown in FIG. 7, the touch panel manufacturing method includes the following steps S21 to S27.

S21: forming the black frame on the substrate by utilization of a first mask.

S22: forming the removable adhesive layer in the display region of the substrate provided with the black frame.

S23: forming the metal layer on the black frame and on the removable adhesive layer.

S24: removing the removable adhesive layer in the display region and removing the first part that the metal layer includes in the display region.

S25: forming a transparent conductive material on the substrate obtained after the step of removing the removable adhesive layer and the first part of the metal layer; and forming the transparent conductive bridges, the transparent conductive leading wires and the metal leading wires by etching the transparent conductive material and etching the metal layer on the substrate provided with the transparent conductive material in the same photolithography process (adopting a second mask in the photolithography process).

S26: forming the insulating layer on the substrate obtained after the photolithography process by utilization of a third mask.

S27: obtaining the touch panel by forming the electrode layer in the display region of the substrate provided with the insulating layer by utilization of a fourth mask.

As can be seen from the above steps S21 to S27, the touch panel manufacturing method provided by the embodiments of the present disclosure can reduce 5 mask processes to 4 mask processes (namely reducing one mask process), and hence simplify the manufacturing process, effectively improve the productivity of the manufacturing process using the masks, and reduce the cost in product development and production.

Detailed description will be given below to the touch panel manufacturing method as shown in FIG. 7 with reference to FIG. 8 to FIG. 14c.

The steps S21, S22, S23 and S24 may respectively refer to the steps S11 to S14 as described above, so no further description will be given here.

S25: forming the transparent conductive material on the substrate obtained after the step of removing the removable adhesive layer in the display region and the first part of the metal layer in the display region; and forming the transparent conductive bridges, the transparent conductive leading wires and the metal leading wires by etching the transparent conductive material and etching the metal layer on the substrate provided with the transparent conductive material in the same photolithography process.

Figure 8:
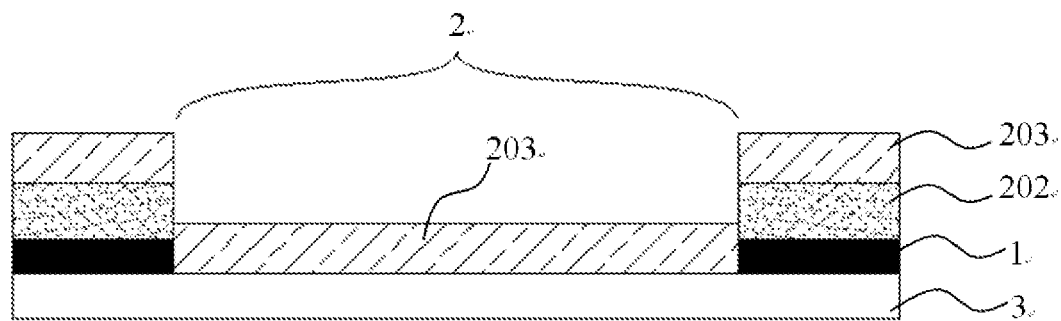
FIG. 8 is a schematic structural view illustrating that a transparent conductive material is formed on the substrate in the embodiments of the present disclosure.

For instance, as shown in FIG. 8 which is a schematic structural view illustrating that the transparent conductive material is formed on the substrate provided by the embodiments of the present disclosure, the transparent conductive material 203, e.g., indium tin oxide (ITO), indium zinc oxide (IZO), indium gallium zinc oxide (IGZO) or similar transparent conductive materials, is deposited on the substrate 3 obtained after the step of removing the removable adhesive layer and the metal layer, namely the transparent conductive material 203 is deposited in the display region 2 and on the black frame 1.

For instance, as shown in FIG. 8, the first part of the transparent conductive material 203 is in the display region 2 and is in direct contact with the substrate 3.

For instance, as shown in FIG. 8, the first part that the transparent conductive material 203 includes in the display region 2 is in direct contact with the second part that the metal layer 202 includes in the frame region. For instance, a lateral surface of the first part of the transparent conductive material 203 is close to and is in direct contact with a lateral surface of the second part of the metal layer 202.

For instance, as shown in FIG. 8, a thickness of the first part that the transparent conductive material 203 includes in the display region 2 is greater than the thickness of the black frame 1, so as to realize the direct contact between the first part of the transparent conductive material 203 and the second part of the metal layer 202.

For instance, the second part that the transparent conductive material 203 includes in the frame region is in direct contact with the second part that the metal layer 202 includes in the frame region.

Figure 9:
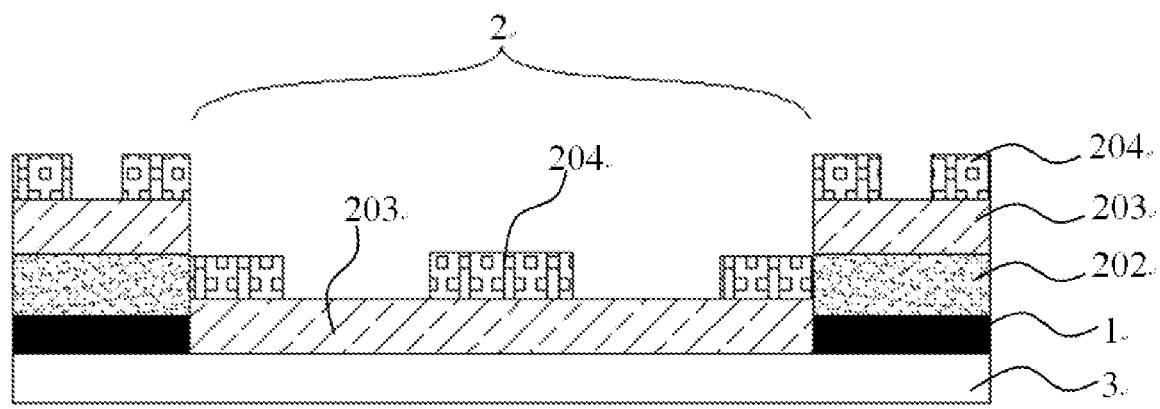
FIG. 9 is a schematic structural view illustrating that a photoresist is formed on the transparent conductive material in the embodiments of the present disclosure.
Figure 10:
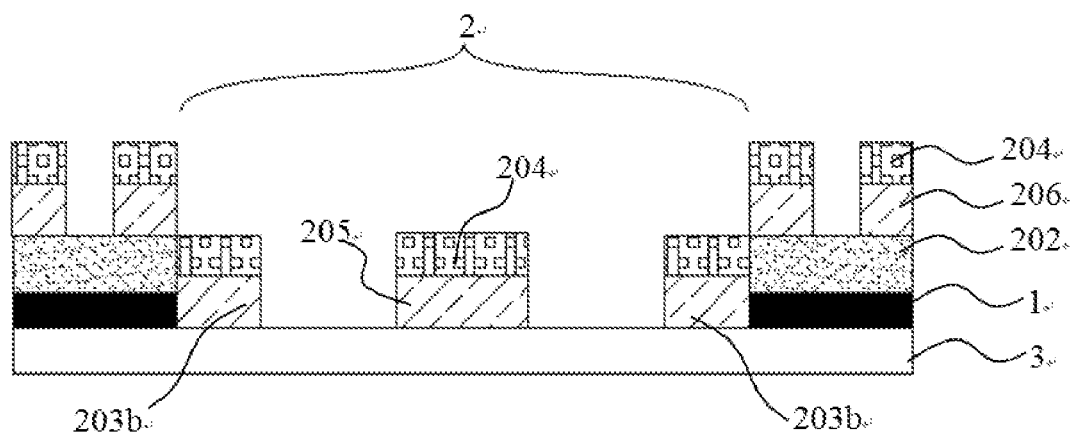
FIG. 10 is a schematic structural view illustrating that the transparent conductive material is etched in the embodiments of the present disclosure.
Figure 11:
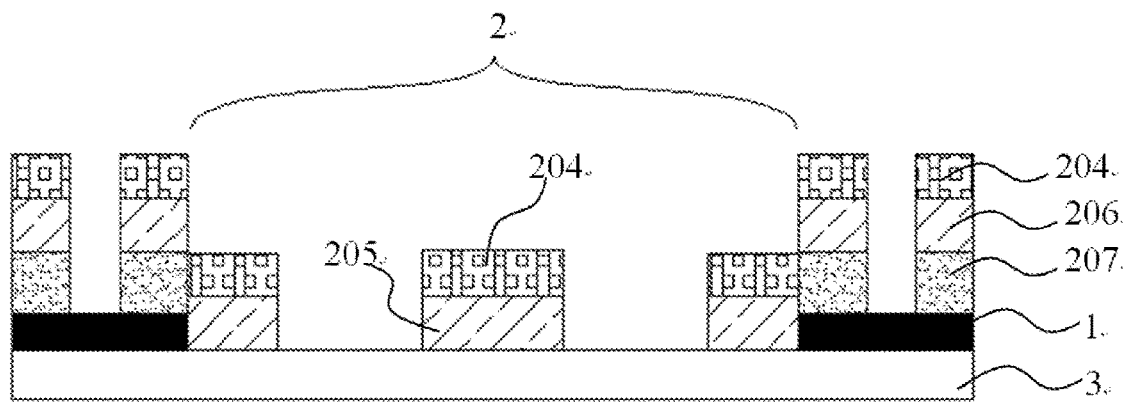
FIG. 11 is a schematic structural view illustrating that the metal layer is etched in the embodiments of the present disclosure.
Figure 12:
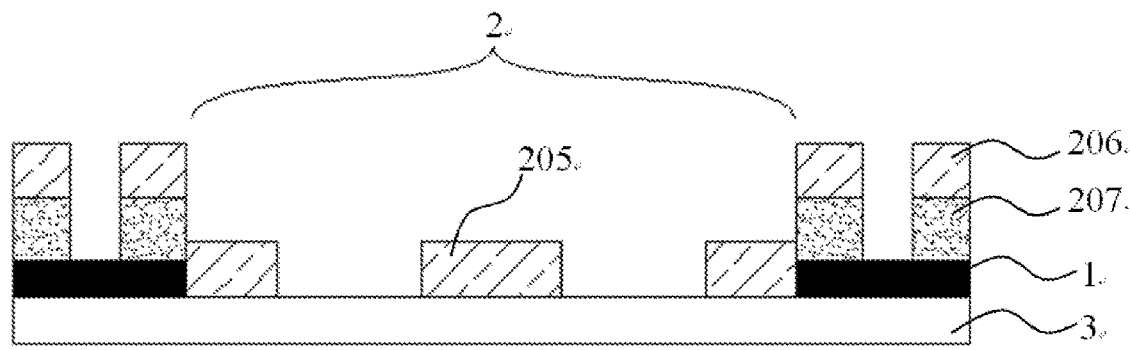
FIG. 12 is a schematic structural view illustrating that the photoresist is peeled off in the embodiments of the present disclosure.

FIG. 9 is a schematic structural view illustrating that a photoresist is formed on the transparent conductive material in the embodiments of the present disclosure. FIG. 10 is a schematic structural view illustrating that the transparent conductive material is etched in the embodiments of the present disclosure. FIG. 11 is a schematic structural view illustrating that the metal layer is etched in the embodiments of the present disclosure. FIG. 12 is a schematic structural view illustrating that the photoresist is removed in the embodiments of the present disclosure. Description will be given below to the method of forming the transparent conductive bridges, the transparent conductive leading wires and the metal leading wires by patterning both the transparent conductive material 203 and the metal layer 202 by utilization of the same photolithography process (namely the same mask process) with reference to FIG. 9 to FIG. 12.

After forming the transparent conductive material 203, a photoresist material is directly formed on the transparent conductive material 203; and subsequently, the photoresist material is subjected to exposure through a mask plate (mask), and the photoresist material exposed is subjected to development, so as to form the photoresist 204 on the transparent conductive material 203, as shown in FIG. 9.

Subsequently, as shown in FIG. 10, the transparent conductive material 203 in the display region 2 and the transparent conductive material 203 on the black frame 1 are etched to allow the first part that the transparent conductive material 203 includes in the display region 2 to form the transparent conductive bridge 205 and allow the second parts that the transparent conductive material 203 includes on the black frame 1 to form the transparent conductive leading wires 206 (four transparent conductive leading wires 206 are shown in FIG. 10 as an example). In the etching process, the photoresist 204 has the function of protecting the transparent conductive material 203 that is in the display region 2 and is covered by the photoresist 204 and protecting the transparent conductive material 203 and the metal layer 202 which are on the black frame 1 and are covered by the photoresist 204.

For instance, in the process of etching the transparent conductive material 203, the photoresist 204 is taken as an etch mask.

For instance, as shown in FIG. 10, the first part that the transparent conductive material 203 includes in the display region 2 is etched to form a leading-wire connection bridge 203b (two leading-wire connection bridges 203b are shown in FIG. 10, for example); and the leading-wire connection bridge 203b is electrically connected with the second part that the metal layer 202 includes in the frame region (for example, a lateral surface of the leading-wire connection bridge 203b is in direct contact with the lateral surface of the second part that the metal layer 202 includes to realize the electrical connection of both).

Subsequently, the second part that the metal layer 202 includes in the frame region is continuously etched to form the metal leading wires 207, as shown in FIG. 11 (four metal leading wires 207 are shown in FIG. 11 as an example).

For instance, in the process of etching the second part of the metal layer 202, the transparent conductive bridge 205 and the transparent conductive leading wires 206 are taken as an etch mask, or the photoresist 204 is taken as the etch mask. In this case, orthographic projections of the transparent conductive leading wires 206 on the substrate 3 coincide with orthographic projections of the metal leading wires 207 on the substrate 3.

Finally, the photoresist 204 in the display region 2 and the frame region provided with the black frame 1 is lifted off, as shown in FIG. 12.

In the step S25, after the removable adhesive layer in the display region and the first part of the metal layer in the display region are stripped off, the etching process of the transparent conductive bridge (e.g., an ITO bridge) and the etching process of the metal leading wires are completed in the same photolithography process (namely the same mask process), and the two etching processes are not required to be performed in different photography processes. Therefore, the occurrence probability of poor electrical performance is reduced, and meanwhile, the equipment utilization rate of photolithography is also reduced.

S26: forming the insulating layer on the substrate obtained after photolithography in the step S25.

Figure 13:
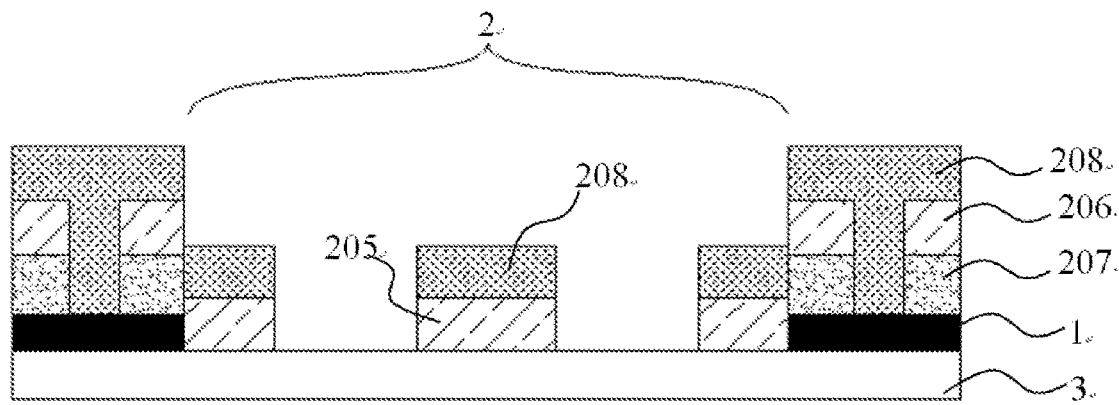
FIG. 13 is a schematic structural view illustrating that an insulating layer is formed on the substrate in the embodiments of the present disclosure.

For instance, as shown in FIG. 13 which is a schematic structural view illustrating that the insulating layer is on the substrate in the embodiments of the present disclosure, the insulating layer 208 is formed by depositing an insulating material on the basis of the structure as shown in FIG. 12.

For instance, the insulating material is an inorganic insulating material, e.g., $SiN_x$, $SiO_2$ or other inorganic insulating materials. For instance, the insulating material may be organic insulating material, or has a superimposed structure of the organic insulating material and the inorganic insulating material.

In the step S26, as shown in FIG. 13, the insulating layer 208 covers the transparent conductive bridge 205 and exposes opposite lateral surfaces of the transparent conductive bridge 205.

For instance, as shown in FIG. 13, in the case where the leading-wire connection bridge 203b is formed, the insulating layer 208 also exposes another lateral surface that is included by the leading-wire connection bridge 203b and is close to the transparent conductive bridge 205.

For instance, as shown in FIG. 13, the insulating layer 208 covers the metal leading wires 207 on the black frame 1, so as to avoid the oxidization of the metal leading wires 207.

For instance, as shown in FIG. 13, the insulating layer 208 is filled into a gap between adjacent metal leading wires 207, so as to avoid short circuit between the adjacent metal leading wires 207.

S27: forming the electrode layer in the display region of the substrate provided with the insulating layer. In this way, the touch panel is obtained after the steps S21 to S27.

Figure 14A:
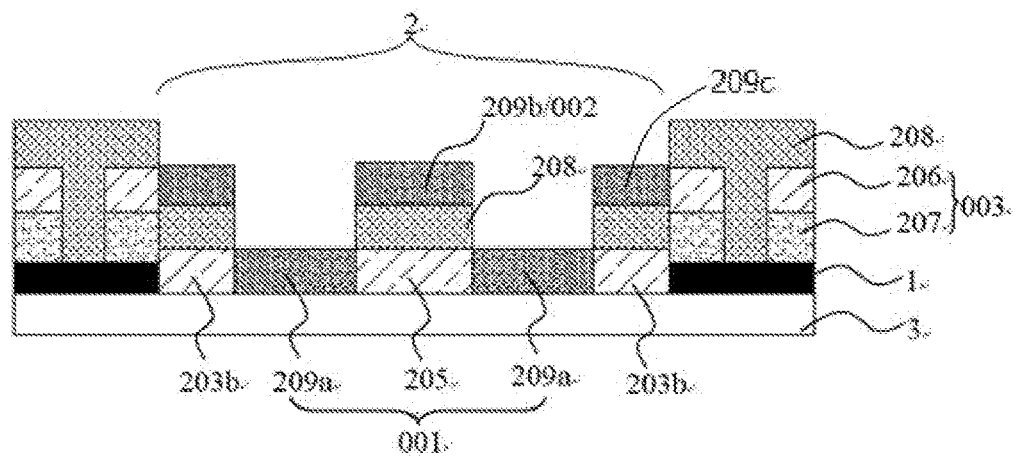
FIG. 14a is a schematic structural view 1 illustrating that an electrode layer is formed on the substrate in the embodiments of the present disclosure.
Figure 14B:
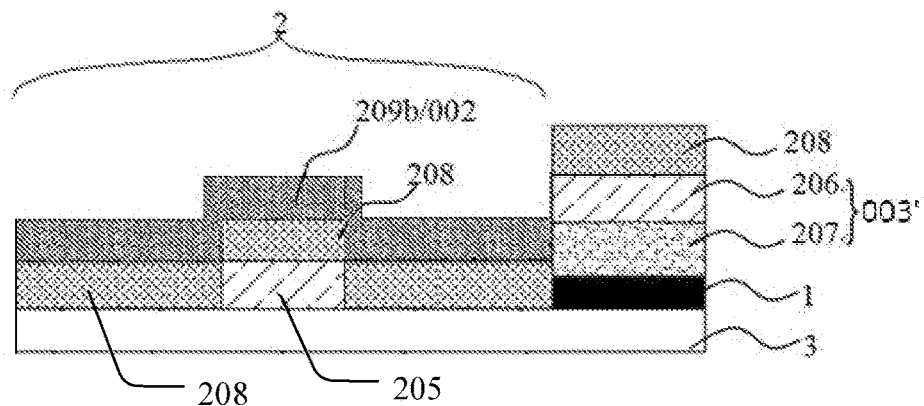
FIG. 14b is a schematic structural view 2 illustrating that the electrode layer is formed on the substrate in the embodiments of the present disclosure.
Figure 14C:
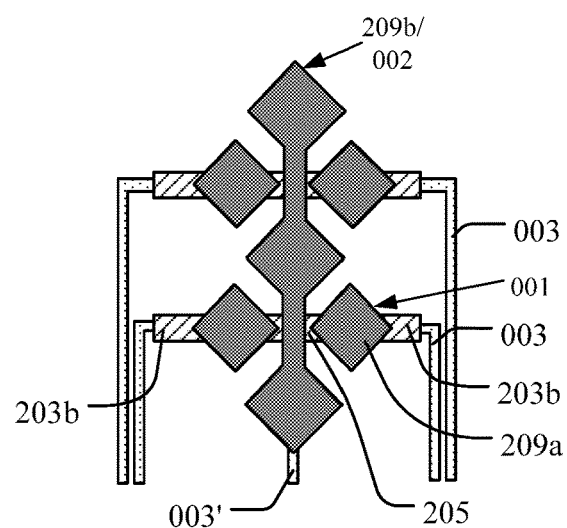
FIG. 14c is a schematic structural view 3 illustrating that the electrode layer is formed on the substrate in the embodiments of the present disclosure.

For instance, as shown in FIG. 14a to FIG. 14c which are schematic structural views illustrating that the electrode layer is formed on the substrate in the embodiments of the present disclosure, on the basis of the structure as shown in FIG. 13, the electrode layer 209 is formed in the display region 2 of the substrate provided with the insulating layer 208. For instance, as shown in FIG. 14a to FIG. 14c, the electrode layer 209 includes a plurality of discrete electrode patterns 209a and a continuous electrode pattern 209b that is disposed between adjacent discrete electrode patterns 209a; the adjacent discrete electrode patterns 209a are electrically connected with each other through the transparent conductive bridge 205 between both; and the continuous electrode pattern 209b is insulated from the transparent conductive bridge 205 through the insulating layer 208. For instance, the electrode layer 209 further includes a pattern 209c on the leading-wire connection bridge 203b; and the pattern 209c is insulated from the continuous electrode pattern 209b.

As shown in FIG. 14a to FIG. 14c, by adoption of the manufacturing process provided by the embodiments of the present disclosure, a first touch electrode 001, a second touch electrode 002, and leading wires 003 and 003' respectively connected with the first touch electrode 001 and the second touch electrode 002 are obtained; the first touch electrode 001 includes the transparent conductive bridge 205 and the discrete electrode patterns 209a electrically connected with the transparent conductive bridge 205; the second touch electrode 002 includes the continuous electrode pattern 209b; extension directions of the second touch electrode 002 and the first touch electrode 001 are intersected with each other, and the second touch electrode and the first touch electrode are insulated from each other at the intersection of the second touch electrode and the first touch electrode through the insulating layer 208; the first touch electrode 001 is electrically connected with a leading wire 003 and the second touch electrode 002 is electrically connected with another leading wire 003'; thus, the touch panel is manufactured.

For instance, as shown in FIG. 14a and FIG. 14b, each leading wire (refer to 003 and 003') includes the metal leading wire 207 and the transparent conductive leading wire 206 which overlap each other and directly contact with each other. As the etching of the second part that the metal layer 202 includes in the frame region and the etching of the second part that the transparent conductive material 203 includes in the frame region are completed in the same photolithography process, the orthographic projection of the metal leading wire 207 on the substrate 3 almost coincides with the orthographic projection of the transparent conductive leading wire 206 on the substrate 3.

For instance, as shown in FIG. 14a, in the case where the leading-wire connection bridge 203b close to the metal leading wire 207 is formed through the etching of the transparent conductive material 203, the discrete electrode pattern 209a of the first touch electrode 001 is electrically connected with the leading-wire connection bridge 203b (for instance, a lateral surface of the discrete electrode pattern 209a is close to and is in direct contact with the another lateral surface of the leading-wire connection bridge to realize the electrical connection of both), and then the first touch electrode 001 is electrically connected with the metal leading wire 207 through the leading-wire connection bridge 203b. That is to say, the discrete electrode pattern 209a and the metal leading wire 207 which are adjacent to the leading-wire connection bridge are electrically connected with each other through the leading-wire connection bridge 203b.

For instance, as shown in FIG. 14b, the continuous electrode pattern 209b of the second touch electrode 002 is electrically connected with the leading wire 003', for instance, the continuous electrode pattern 209b is in direct contact with the lateral surface of the transparent conductive leading wire 206 and the lateral surface of the metal leading wire 207 to realize the electrical connection between the continuous electrode pattern 209b and the leading wire 003'.

It should be noted that the structures as shown in FIG. 14a to FIG. 14c are only illustrative. In actual application, for instance, the electrode layer 209 includes a plurality of the first touch electrodes 001 and a plurality of the second touch electrodes 002 (description is given in FIG. 14b by taking one second touch electrode 002 as an example); and each first touch electrode 001 includes a plurality of the discrete electrode patterns 209a and a plurality of the transparent conductive bridges 205 (description is given in FIG. 14a to FIG. 14c by taking one transparent conductive bridge 205 as an example).

For instance, the electrode layer 209 may be obtained by the deposition of the transparent conductive material and the photolithography of the transparent conductive material.

For instance, the electrode layer 209 is formed of ITO, IZO, IGZO or similar transparent conductive materials.

Figure 16:
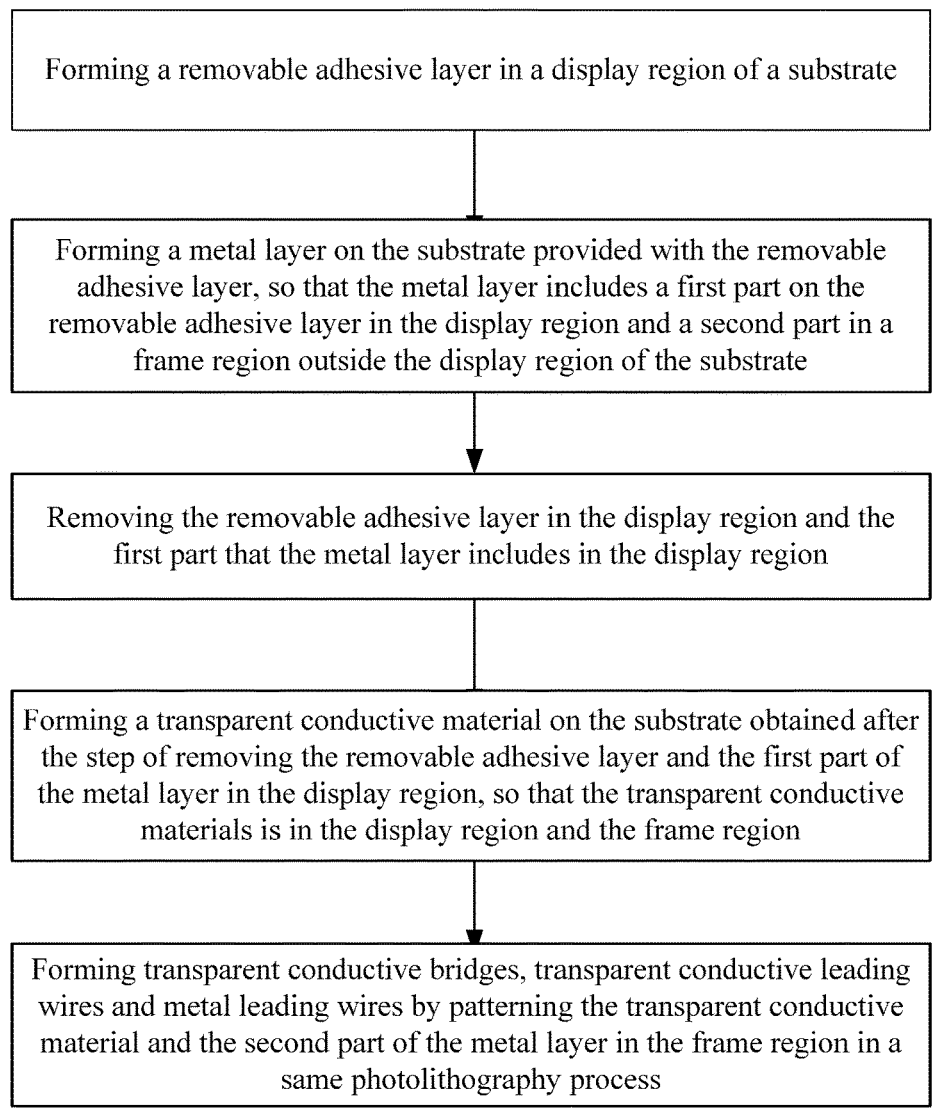
FIG. 16 is a flowchart of the touch panel manufacturing method provided by still another embodiment of the present disclosure.

At least one embodiment of the present disclosure provides another touch panel manufacturing method. As shown in FIG. 16, the manufacturing method includes: forming the removable adhesive layer in the display region of the substrate; forming the metal layer on the substrate provided with the removable adhesive layer, so that the metal layer includes the first part on the removable adhesive layer in the display region and the second part in the frame region outside the display region of the substrate; removing the removable adhesive layer in the display region and the first part of the metal layer in the display region; forming the transparent conductive material on the substrate obtained after the step of removing the removable adhesive layer and the first part of the metal layer in the display region, so that the transparent conductive material is disposed in the display region and the frame region; and forming the transparent conductive bridge, the transparent conductive leading wire and the metal leading wire by patterning both the transparent conductive material and the second part of the metal layer in the frame region in the same photolithography process.

For instance, the manufacturing method provided by the embodiments of the present disclosure can be used for manufacturing an OGS touch panel. In this case, before the step of forming the removable adhesive layer, the method further includes the step of forming the black frame in the frame region of the substrate.

For instance, the manufacturing method provided by the embodiments of the present disclosure can be used for manufacturing an on-cell touch panel, and in this case, the black frame is not formed in the frame region of the substrate.

For instance, in the situation where there is no black frame in the frame region and both the removable adhesive layer and the metal layer are in direct contact with the substrate, the cohesive force between the removable adhesive layer and the substrate is less than the cohesive force between the metal layer and a part of the substrate in the frame region, so as to avoid the second part of the metal layer in the frame region from falling off the substrate in the process of removing the first part of the metal layer in the display region.

The steps in the manufacturing method provided by the embodiments of the present disclosure as shown in FIG. 16 may refer to the steps in the manufacturing method as shown in FIG. 2 and FIG. 7. No further description will be given here.

The embodiments of the present disclosure further provide the touch panel, which is manufactured by the touch panel manufacturing method provided by any foregoing embodiment. The touch panel manufactured by the touch panel manufacturing method provided by the embodiments of the present disclosure has the advantages of stable structure and high yield.

At least one embodiment of the present disclosure further provides the touch panel. As shown in FIG. 14a to FIG. 14c, the touch panel includes: the substrate 3 including the display region 2 and the frame region disposed outside the display region 2; the first touch electrode 001 which is in the display region 2 and includes the plurality of the discrete electrode patterns 209a and the transparent conductive bridge 205, so that the transparent conductive bridge 205 is disposed between adjacent discrete electrode patterns 209a and electrically connected with the adjacent discrete electrode patterns 209a; the second touch electrode 002 disposed in the display region 2 and intersected with the first touch electrode 001; and a plurality of leading wires 003 disposed in the frame region of the substrate 3 and respectively electrically connected with the first touch electrode 001 and the second touch electrode 002. In the touch panel, each leading wire 003 includes the metal leading wire 207 and the transparent conductive leading wire 206 which overlap each other and directly contact each other; and the orthographic projection of the metal leading wire 207 on the substrate 3 coincides with the orthographic projection of the transparent conductive leading wire 206 on the substrate 3.

In some embodiments of the present disclosure, as shown in FIG. 14a to FIG. 14c, the touch panel further includes the insulating layer 208. The insulating layer 208 includes a part disposed at the intersection of the first touch electrode 001 and the second touch electrode 002 so as to insulate the first touch electrode 001 from the second touch electrode 002.

For instance, the touch panel provided by the embodiments of the present disclosure is the OGS touch panel. In this case, as shown in FIG. 14a to FIG. 14c, the black frame 1 is also disposed in the frame region outside the display region 2 of the substrate 3 and is disposed between the metal leading wire 207 and the substrate 3.

For instance, the touch panel provided by the embodiments of the present disclosure is the on-cell touch panel. In this case, the black frame is not disposed in the frame region outside the display region 2 of the substrate 3.

The arrangement mode and the manufacturing method of the components in the touch panel provided by any foregoing embodiment of the present disclosure may refer to relevant description in the manufacturing method provided by any foregoing embodiment. No further description will be given here.

The embodiments of the present disclosure further provide a display device, which includes the touch panel provided by any foregoing embodiment.

For instance, the display device is an OGS touch display device, which includes a display panel and the touch panel. The display panel includes an array substrate and an opposed substrate which are opposite to each other, and a sealing structure connects the array substrate and the opposed substrate; and the opposed substrate is disposed between the array substrate and the touch panel.

For instance, the display device is an on-cell touch display device, which includes a display panel. The display panel includes an array substrate and an opposed substrate which are opposite to each other, and a sealing structure connects the array substrate and the opposed substrate; the opposed substrate is taken as the substrate in the touch panel; and the first touch electrode, the second touch electrode and the leading wires in the touch panel are formed on one side of the opposed substrate away from the array substrate.

As can be seen, in the embodiments of the present disclosure, the removable adhesive layer is formed in the display region of the substrate provided with the black frame at first, and then the metal layer is formed on the black frame and the removable adhesive layer; and subsequently, the removable adhesive layer in the display region and the metal layer in the display region are stripped off, so the touch panel manufacturing method can reduce from 5 mask processes to 4 mask processes (namely reducing one mask process). Therefore, the manufacturing process is simplified; the productivity of the manufacturing process using the masks is effectively improved; and the cost in product development and production is reduced.

In the manufacturing method provided by the embodiments of the present disclosure, the etching process of the connection bridge (e.g., the ITO bridge) and the etching process of the metal leading wires (metal traces) are completed in the same photolithography process (namely the same mask process), and the two etching processes are not required to be performed in different photolithography processes. Thus, the occurrence probability of poor electrical performance can be reduced, and meanwhile, the equipment utilization rate of photolithography can be also reduced. Moreover, the removable adhesive layer is utilized to directly remove the metal layer in the display region, so as to effectively avoid the metal residue in the display region caused by the exposure and etching processes.

What are described above is related to the illustrative embodiments of the disclosure only and not limitative to the scope of the disclosure; the scopes of the disclosure are defined by the accompanying claims.

What is claimed is:

1. A touch panel manufacturing method, comprising:
    forming a black frame on a substrate;
    forming a removable adhesive layer in a display region of the substrate provided with the black frame;
    forming a metal layer on the black frame and the removable adhesive layer;
    removing the removable adhesive layer in the display region and a first part of the metal layer in the display region; and
    obtaining a touch panel by performing photolithography on the substrate obtained after removing the removable adhesive layer and the first part of the metal layer in the display region, wherein the obtaining the touch panel by performing the photolithography on the substrate obtained after the removing the removable adhesive layer and the first part of the metal layer in the display region comprises:
    forming a transparent conductive material on the substrate obtained after the removing the removable adhesive layer and the first part of the metal layer in the display region; and
    forming transparent conductive bridges, transparent conductive leading wires, and metal leading wires, by etching the transparent conductive material and etching a second part of the metal layer in a region provided with the black frame, on the substrate provided with the transparent conductive material.

2. The touch panel manufacturing method according to claim 1, wherein the etching the transparent conductive material and the etching the second part of the metal layer are performed in a same photolithography process.

3. The touch panel manufacturing method according to claim 1, wherein orthographic projections of the transparent conductive leading wires on the substrate coincide with orthographic projections of the metal leading wires on the substrate, respectively.

4. The touch panel manufacturing method according to claim 1, wherein the transparent conductive material is in direct contact with the second part of the metal layer.

5. The touch panel manufacturing method according to claim 1, wherein the forming the removable adhesive layer in the display region of the substrate provided with the black frame comprises:
    forming the removable adhesive layer in the display region of the substrate provided with the black frame by a screen printing process.

6. The touch panel manufacturing method according to claim 1, wherein a thickness of the removable adhesive layer is greater than a height of the black frame.

7. The touch panel manufacturing method according to claim 1, wherein the removing the removable adhesive layer in the display region and the first part of the metal layer in the display region comprises:
    bonding an adhesive strip to the metal layer in the display region; and
    by peeling off the adhesive strip to separate the removable adhesive layer in the display region from the substrate, removing the removable adhesive layer in the display region and the metal layer in the display region.

8. The touch panel manufacturing method according to claim 7, wherein a cohesive force between the adhesive strip and the metal layer is greater than a cohesive force between the removable adhesive layer and the substrate; and a cohesive force between the metal layer and the removable adhesive layer is greater than the cohesive force between the removable adhesive layer and the substrate.

9. The touch panel manufacturing method according to claim 8, wherein the cohesive force between the removable adhesive layer and the substrate is less than a cohesive force between the metal layer and the black frame.

10. The touch panel manufacturing method according to claim 1, wherein the obtaining the touch panel by performing the photolithography on the substrate obtained after the removing the removable adhesive layer and the first part of the metal layer in the display region further comprises:
    forming an insulating layer on the substrate obtained after the etching the transparent conductive material and the etching the second part of the metal layer.

11. The touch panel manufacturing method according to claim 10, wherein the obtaining the touch panel by performing the photolithography on the substrate obtained after the removing the removable adhesive layer and the first part of the metal layer in the display region further comprises:
    obtaining the touch panel by forming an electrode layer in the display region of the substrate provided with the insulating layer.

12. The touch panel manufacturing method according to claim 11, wherein the electrode layer comprises a plurality of discrete electrode patterns and a continuous electrode pattern between the plurality of discrete electrode patterns; and adjacent ones of the plurality of discrete electrode patterns are electrically connected with each other through one of the transparent conductive bridges.

13. The touch panel manufacturing method according to claim 12, wherein a leading-wire connection bridge close to the metal leading wires is formed by the etching the transparent conductive material; and one of the plurality of discrete electrode patterns and one of the metal leading wires are adjacent to the leading-wire connection bridge and are electrically connected with each other through the leading-wire connection bridge.

14. The touch panel manufacturing method according to claim 12, wherein the continuous electrode pattern is in contact with a lateral surface of one of the transparent conductive leading wires and a lateral surface of another one of the metal leading wires.

15. A touch panel manufacturing method, comprising:
forming a removable adhesive layer in a display region of a substrate;
forming a metal layer on the substrate provided with the removable adhesive layer, wherein the metal layer comprises a first part on the removable adhesive layer in the display region and a second part in a frame region that is outside the display region of the substrate;
removing the removable adhesive layer in the display region and the first part of the metal layer in the display region;
forming a transparent conductive material on the substrate obtained after the removing the removable adhesive layer and the first part of the metal layer in the display region, wherein the transparent conductive material is in the display region and the frame region; and
forming a transparent conductive bridge, a transparent conductive leading wire, and a metal leading wire by patterning the transparent conductive material and patterning the second part of the metal layer in the frame region in a same photolithography process.

16. A touch panel, which is manufactured by the touch panel manufacturing method according to claim 1.

17. A touch panel manufactured by using the touch panel manufacturing method according to claim 1, comprising:
the substrate comprising the display region and a frame region outside the display region;
a first touch electrode in the display region, wherein the first touch electrode comprises a plurality of discrete electrode patterns and a transparent conductive bridge that is between adjacent ones of the plurality of discrete electrode patterns and is electrically connected with the adjacent ones of the plurality of discrete electrode patterns;
a second touch electrode in the display region, wherein the second touch electrode intersects the first touch electrode; and
a plurality of leading wires in the frame region and respectively electrically connected with the first touch electrode and the second touch electrode,
wherein each leading wire comprises a metal leading wire and a transparent conductive leading wire which overlap with each other and directly contact with each other; and an orthographic projection of the metal leading wire on the substrate coincides with an orthographic projection of the transparent conductive leading wire on the substrate.

18. The touch panel according to claim 17, further comprising an insulating layer, wherein the insulating layer comprises a part at an intersection of the first touch electrode and the second touch electrode to insulate the first touch electrode from the second touch electrode.

19. A display device, comprising a display panel and the touch panel according to claim 17.

* * * * *